United States Patent [19]

Payne

[11] 4,169,337

[45] Oct. 2, 1979

[54] PROCESS FOR POLISHING SEMI-CONDUCTOR MATERIALS

[75] Inventor: Charles C. Payne, Chicago, Ill.

[73] Assignee: Nalco Chemical Company, Oak Brook, Ill.

[21] Appl. No.: 891,665

[22] Filed: Mar. 30, 1978

[51] Int. Cl.$^2$ ............................................. B24B 1/00
[52] U.S. Cl. ................................. 51/283 R; 51/308; 106/3
[58] Field of Search .................... 51/308, 281, 283 R; 106/3; 252/97, 98, 102, 110, 113, 120

[56] References Cited

U.S. PATENT DOCUMENTS

| 3,874,129 | 4/1975 | Deckert | 51/308 |
| 4,062,658 | 12/1977 | Byrne | 51/308 |
| 4,117,093 | 9/1978 | Brunner et al. | 51/308 |

*Primary Examiner*—Donald J. Arnold
*Attorney, Agent, or Firm*—John G. Premo; Robert A. Miller

[57] ABSTRACT

Semi-conductors can be polished with greater efficiency by using as a polishing agent a blend of colloidal silica or silica gel and a water-soluble amine.

5 Claims, No Drawings

PROCESS FOR POLISHING SEMI-CONDUCTOR MATERIALS

INTRODUCTION

U.S. Pat. No. 3,170,273, the disclosure of which is incorporated herein by reference, shows that colloidal silica and silica gels are useful as polishing agents for the surfaces of semi-conductor crystals which are most often used in the manufacture of semi-conductor devices. The siliceous polishing agents of this patent are particularly suited to producing highly polished surfaces on silicon crystal wafers, thus rendering these surfaces suitable for the disposition of an epitaxially deposited crystal layer.

The silica sols and silica gels used by the patentee have an ultimate particle size of 4–200 millimicrons. From a commercial standpoint, it is preferred to use as the polishing agents in the process of the patent aqueous colloidal silica sols having particle sizes within the range of 4–100 millimicrons.

THE INVENTION

In accordance with the invention, it has been found that semi-conductor surfaces of the type previously described and, most particularly, silicon, can be efficiently polished by using as the polishing agent a combination of either a colloidal silica sol or silica gel having an ultimate particle size within the range of 4–200 millimicrons and, preferably, 4–100 millimicrons, with a water-soluble amine. The amount of amine in relation to the silica present in the silica sol or gel may range between 0.1–5% based on the $SiO_2$ content of the sol or gel. The preferred amount of the amine is 1.0–5% and, most preferably, it is 2.0%–4.0%.

The amines should contain between 2–8 carbon atoms and are preferably aliphatic in character. Diamines containing 2–8 carbon atoms and, preferably, aliphatic in character will also give excellent polishing results. Most preferably, the amines containing one primary amino group or containing several amino groups should be used. Preferred amines contain at least one hydroxy alkyl group and one primary amino group.

To illustrate the advantages of the invention, the following test method was used:

A. Polishing Machine

Strasbough Model 6LA with an 18" polishing plate and fixed rotational speed of 280 rpm. The wafer holder was a metal plate with plastic insert and recessed cavity capable of holding 3" diameter wafers by the capillary action of water.

B. Silicon Wafers

From Galamar, Inc., Calif., P Type, 1-0-0 lattice, 3.0 inch±0.025 dia., 0.020 inch±0.002 thickness.

C. Pads

1. Stock Removal Pad—Rodel Subra IV
2. Final Polish Pad—Rodel 600

D. Operating Conditions

1. Pressures and Times=9.6 lbs/in.$^2$ for 15 minutes or 40.0 lbs/in.$^2$ for 3 minutes.
2. Polishing speed=280 rpm
3. Silica Conc.=1.25%, 2.5%, 5.0%, 10.0%
4. pH=11.0±0.2
5. Caustic used for pH adjustment=20% NaOH
6. Flow Rate=30 ml/min. at 9.6 lbs/in.$^2$ 110 ml/min. at 40.0 lbs/in.$^2$

E. Operating Procedure

1. One 30 minute break-in run for each pad.
   a. Low Pressure
      (1) Rough polish 15 minutes at prescribed flow rate;
      (2) Final polish 1 minute at flow rate of 50 ml/mn;
      (3) Wash with DI $H_2O$;
      (4) Wash with surfactant;
      (5) Wash with DI $H_2O$;
      (6) Immerse in 2% HF for one minute;
      (7) Wash with DI $H_2O$ one minute;
      (8) Dry with lens tissue.
   b. High Pressure Runs
      (1) Rough polish 3 minutes at prescribed flow rate;
      (2) Continue procedure as with step (2) for low pressure runs.

F. Measurement of Polishing Rates

Polishing rates were determined using 3 measurements: One at the center and two at the outside edges of the wafer. Flatness was measured by two additional measurements perpendicular to the other three. An ADE Corporation electronic thickness gauge was used to make all measurements.

G. Test Solutions

Table I gives the sub-designations of all products.
Products labeled A and B represent the amine level used in a 50% product.
A=2% Amine (wt.)
B=4% Amine (wt.)

The percent silica used was determined using a hydrometer. The specific gravities of the test solutions were adjusted to approximately the following values:

| Silica | Specific Gravity |
|---|---|
| 1.25% | 1.007 |
| 2.5% | 1.014 |
| 5.0% | 1.029 |
| 10.0% | 1.059 |

All of the tests used commercial colloidal silica sols which were sold as Nalcoag ® 1050 and Nalcoag ® 1060. The general description of these two sols is presented below:

| Nalcoag ®[1] 1050 | |
|---|---|
| Colloidal Silica as $SiO_2$ | 50% |
| pH | 9.0 |
| Average Particle Size | 17–25 Mµ |
| Average Surface Area | 120–176 M$^2$/gram |
| Specific Gravity (at 68° F.) | 1.390 |
| Viscosity | 70 cp (max) |
| $Na_2O$ | 0.4% |
| Nalcoag ® 1060 | |
| Colloidal Silica as $SiO_2$ | 50% |
| pH | 8.5 |
| Average Particle Size | 50–70 Mµ |
| Average Surface Area | 40–60 M$^2$/gram |
| Specific Gravity (at 68° F.) | 1.390 |
| Viscosity at 77° F. | 15 cp (max) |

The amines used in the test are set forth below in Table I.

[1] ®Registered Trademark, Nalco Chemical Company

TABLE I

DESCRIPTION OF AMINES USED FOR FIELD TRIAL

| SUB DESIG-NATION* | CHEMICAL COMPOSITION | BOILING POINT °C. |
|---|---|---|
| 1 | EDA + 4 moles Ethylene Oxide | — |
| 2 | EDA + 4 moles Propylene Oxide | 192°/0.5 mm |
| 3 | Pentahydroxypropyl Diethylenetriamine | — |
| 4 | Triethanolamine | 277°/50 mm |
| 5 | Diethanolamine | 270°/48 mm |
| 6 | Isopropylamine | 160° |
| 7 | Aminoethylethanolamine | 243° |
| 8 | Polyglycolamine | 277° |
| 9 | 1-2, diaminopropane | 119° |
| 10 | 1-3, diaminopropane | 135°/738 mm |
| 11 | Triethylenetetramine | 266° |
| 12 | Tetraethylenepentamine | 333° |
| 13 | Ethylenediamine (EDA) | 117° |
| 14 | 1-amino-2-methylpropanol | 165° |
| 15 | Dimethylaminoisopropanol | 125° |
| 16 | Methoxypropylamine | 95° C. (azeotropes) |

*A further subdesignation was used:
A = 2 wt. % amine
B = 4 wt. % amine

Using the test method described, the results of the tests are set forth in Tables II, III, IV, V, and VI presented hereafter.

The test solutions were adjusted to the above specific gravities and the pH raised to 11.0±0.2 with 20% NaOH using good stirring. The pH was determined before, during and after the run. Every time a new product was tested, the pad was washed and scraped using a razor blade until no more product remained in the pad (foaminess while scraping indicated that the product remained in the pad). The pad was changed after run number seven in Table II because of the spindle slipping out of position and gouging the pad and after run number 13 in Table III before the dosage curves were run. The results in Table II for 1050 (run number 7) indicate that essentially no previous products remain in the pad to affect the polishing results.

Based on the screening tests for the different amines, aminoethylethanolamine (7) was selected over 1-3 di-aminopropane (10) or triethylenetetramine (11) because of the following reasons:

1. Aminoethylethanolamine has a boiling point of 243° C.;
2. Aminoethylethanolamine shows better compatibility in Nalcoag ® 1060.
3. Aminoethylethanolamine has relatively low toxicity.

The screening tests were done on products containing 4% amine except with the primary amines: 1,3 diaminopropane (10), triethylenetetramine (11) and tetraethylenepentamine (12) where 2% amine levels were used. The decision to use 2% amine was based upon the 1315 product (Nalcoag ® 1060 + 1.86% ethylenediamine) results and the previous screening tests of the primary, secondary and tertiary amines.

The 1050 run (No. 12 of Table III) had a high value of 1.42 compared to 1.16 (Run No. 13) because the pad was presoaked with slurry prior to running. All tests were done on pads which were not presoaked prior to making a run.

Tables IV-VI show the results of the performance curves for aminoethylethanolamine in 1060 at 2% (7A Runs) and 4% (7B Runs) amine levels. The pad was changed between runs 4 and 5 in Table V when the 2% amine tests were started. The performance curves were made by preparing a 10% test solution from the 50% product containing 2% or 4% aminoethylethanolamine; running the appropriate tests and then diluting to 5%, 2.5% and finally 1.25% from this mixture. For the runs made in Table VI, both a new pad and a new wafer holder were used.

The results of Table VI show the differences in polishing rates and wafer quality (1 = excellent, 3 = acceptable, 5 = bad) for Nalcoag ® 1050 versus Nalcoag ® 1060 containing 2% aminoethylethanolamine at a 1.25% SiO$_2$ level. Run No. 9 on Table VI was made immediately after Run No. 8 and the equipment was still quite warm. The high value is probably due to the increase in temperature for that run as the value of 1.39 mils removal falls on a predicted curve for the product.

TABLE II

| NUMBER | PRODUCT | SOLUTION CONCENTRATION | PRESSURE (lbs/in$^2$) | pH | FLOW (ml/min) | TEMPERATURE (°F.) | HAZE* | POLISHING RATE (Mils Removed) |
|---|---|---|---|---|---|---|---|---|
| 1 | 1050 | 5% | 9.6 | 11 | 30 | 107-124 | 2 | 0.97 |
| 2 | 1050 | 5% | 9.6 | 11 | 30 | 103-124 | 2.5 | 0.96 |
| 3 | 1315 | 5% | 9.6 | 11 | 30 | 106-126 | 2.5 | 1.78 |
| 4 | 1315 | 5% | 9.6 | 11 | 30 | 94.123 | 3.0 | 1.61 |
| 5 | 7B | 5% | 9.6 | 11 | 30 | 103-127 | 2.5 | 1.51 |
| 6 | 7B | 5% | 9.6 | 11 | 30 | 107-130 | contaminated with grease | 1.74 |
| 7 | 1050 | 5% | 9.6 | 11 | 30 | 105-126 | 3 | 0.99 |
| 8 | 5B | 5% | 9.6 | 11 | 30 | 120-127 | 3 | 1.31 |
| 9 | 5B | 5% | 9.6 | 11 | 30 | 110-126 | 3 | 1.30< |
| 10 | 14B | 5% | 9.6 | 11 | 30 | 110-128 | 2.5 | 0.96 |

*Haze Values
1 = Perfect, 2 = Very Good 3 = Acceptable, 4 = Unacceptable 5 = Very Bad

TABLE III

| NUMBER | PRODUCT | CONCEN-TRATION | PRESSURE (lbs/in$^2$) | pH | FLOW (ml/min) | TEMPERATURE (°F.) | HAZE | POLISHING RATE (Mils Removed) |
|---|---|---|---|---|---|---|---|---|
| 1 | 3B | 5 | 9.6 | 11 | 30 | 96-123 | 5+ | 0.25 |
| 2 | 2B | 5 | 9.6 | 11 | 30 | 108-126 | 5+ | 0.30 |
| 3 | 16B | 5 | 9.6 | 11 | 30 | 108-130 | 2.5 | 0.85 |
| 4 | 15B | 5 | 9.6 | 11 | 30 | 105-125 | 2.5 | 1.08 |
| 5 | 1050 | 5 | 9.6 | 11.35 | 30 | 105-120 | 3 | 1.09 |

TABLE III-continued

| NUMBER | PRODUCT | CONCEN-TRATION | PRESSURE (lbs/in²) | pH | FLOW (ml/min) | TEMPERATURE (°F.) | HAZE | POLISHING RATE (Mils Removed) |
|---|---|---|---|---|---|---|---|---|
| 6 | 4B | 5 | 9.6 | 11 | 30 | 95-127 | Micro scratches in wafer | 0.83 |
| 7 | 8B | 5 | 9.6 | 11 | 30 | 104-126 | Orange Peel | 0.67 |
| 8 | 10A | 5 | 9.6 | 11 | 30 | 108-127 | 3.5 (1.5-2 min. Polish) | 1.55 |
| 9 | 10A | 5 | 9.6 | 11 | 30 | 101-125 | 2.0 | 1.75 |
| 10 | 11A | 5 | 9.6 | 11.0 | 30 | 105-124 | 3.0 | 1.74 |
| 11 | 12A | 5 | 9.6 | 11.0 | 30 | 108-122 | 3.0 | 1.34 |
| 12 | 1050 | 5 | 9.6 | 11.35 | 30 | 110-121 | 2.5 | 1.42 |
| 13 | 1050 | 5 | 9.6 | 11.35 | 30 | 103-121 | 3.0 | 1.16 |

TABLE IV

| NUMBER | PRODUCT | CONCEN-TRATION | PRESSURE (lbs/in²) | pH | FLOW (ml/min) | TEMPERATURE (°F.) | HAZE | POLISHINH RATE (Mils removed) |
|---|---|---|---|---|---|---|---|---|
| 1 | 1050 | 5% | 9.6 | 11.1 | 30 | 108-123 | 3 | 1.12 |
| 2 | 7B | 10% | 9.6 | 11.0 | 30 | 112-128 | 2.5 | 1.63 |
| 3 | 7B | 10% | 9.6 | 11.0 | 30 | 115-129 | 3 | 1.78 |
| 4 | 7B | 10% | 40.0 | 11.0 | 110 | 135-164 | 3.2 | 1.39 |
| 5 | 7B | 10% | 40.0 | 11.0 | 110 | 144-174 | 3 | 1.45 |
| 6 | 7B | 5% | 9.6 | 11.0 | 30 | 111-127 | 3 | 1.51 |
| 7 | 7B | 5% | 9.6 | 11.0 | 30 | 110-125 | 3 | 1.53 |
| 8 | 7B | 5% | 40.0 | 11.0 | 110 | 154-174 | 3 | 1.57 |
| 9 | 7B | 5% | 40.0 | 11.0 | 110 | 155-172 | 2.5 | 1.38 |
| 10 | 7B | 5% | 40.0 | 11.2 | 110 | 155-178 | 3 | 1.57 |
| 11 | 7B | 2.5% | 9.6 | 11.0 | 30 | 109-129 | 3 | 1.51 |
| 12 | 7B | 2.5% | 9.6 | 11.0 | 30 | 107-127 | 2.5 | 1.53 |
| 13 | 7B | 2.5% | 40.0 | 11.0 | 110 | 147-175 | 2.5 | 1.45 |
| 14 | 7B | 2.5% | 40.0 | 11.0 | 110 | 157-176 | 2.0 | 1.45 |

TABLE V

| NUMBER | PRODUCT | CONCEN-TRATION | PRESSURE (lbs/in²) | pH | FLOW (ml/min) | TEMPERATURE (°F.) | HAZE | POLISHING RATE (Mils Removed) |
|---|---|---|---|---|---|---|---|---|
| 1 | 7B | 1.25% | 9.6 | 11.0 | 30 | 106-124 | 3.5 | 1.31 |
| 2 | 7B | 1.25% | 9.6 | 11.0 | 30 | 108-126 | 3.5 | 1.38 |
| 3 | 7B | 1.25% | 40.0 | 11.0 | 110 | 147-173 | 3.0 | 1.36 |
| 4 | 7B | 1.25% | 40.0 | 10.9 | 110 | 157-174 | 3.0 | 1.39 |
| 5 | 7A | 5.0% | 9.6 | 11.0 | 30 | 104-127 | 3.0 | 1.45 |
| 6 | 7A | 5.0% | 9.6 | 11.0 | 30 | 105-132 | 3.0 | 1.69 |
| 7 | 7A | 5.0% | 9.6 | 11.0 | 30 | 113-133 | 3.0 | 1.67 |
| 8 | 7A | 5.0% | 40.0 | 11.0 | 110 | 155-174 | 3.0 | 1.44 |
| 9 | 7A | 5.0% | 40.0 | 11.0 | 110 | 162-174 | 3.0 | 1.48 |
| 10 | 7A | 2.5% | 9.6 | 11.1 | 30 | 122-133 | 3.0 | 1.56 |
| 11 | 7A | 2.5% | 9.6 | 11.0 | 30 | 122-133 | 3.0 | 1.56 |
| 12 | 7A | 2.5% | 40.0 | 11.0 | 110 | 155-175 | 3.0 | 1.50 |
| 13 | 7A | 2.5% | 40.0 | 11.0 | 110 | 165-179 | 2.5 | 1.48 |

TABLE VI

| NUMBER | PRODUCT | CONCEN-TRATION | PRESSURE (lbs/in²) | pH | FLOW (ml/min) | TEMPERATURE (°F.) | HAZE | POLISHING RATE (Mils Removed) |
|---|---|---|---|---|---|---|---|---|
| 1 | 1050 | 1.25% | 9.6 | 11.0 | 30 | 113-126 | 5 | 0.85 |
| 2 | 1050 | 1.25% | 9.6 | 11.0 | 30 | 105-124 | 5 | 0.88 |
| 3 | 1050 | 2.5% | 9.6 | 11.0 | 30 | 109-127 | 4.5 | 0.87 |
| 4 | 1050 | 2.5% | 9.6 | 11.0 | 30 | 113-125 | 3.0 | 1.01 |
| 5 | 1050 | 2.5% | 9.6 | 11.0 | 30 | 114-125 | 2.5 | 1.09 |
| 6 | 1050 | 5.0% | 9.6 | 11.0 | 30 | 112-128 | 3.0 | 1.27 |
| 7 | 1050 | 5.0% | 9.6 | 11.0 | 30 | 114-129 | 2.5 | 1.31 |
| 8 | 7A | 1.25% | 9.6 | 11.1 | 30 | 112-126 | 3.0 | 1.39 |
| 9 | 7A | 1.25% | 9.6 | 11.0 | 30 | 118-129 | 3.0 | 1.56 |
| 10 | 7A | 1.25% | 40.0 | 11.0 | 110 | 153-170 | 3.0 | 1.23 |
| 11 | 7A | 1.25% | 40.0 | 11.0 | 110 | 158-170 | 3.0 | 1.28 |

I claim:

1. An improved method for polishing silicon wafers and like materials which comprises polishing them with a polishing agent which comprises an aqueous colloidal silica sol or a gel which is combined with 0.1%-5% by weight of a water-soluble amine based on the SiO$_2$ content of the sol.

2. The method of claim 1 where the polishing agent contains a silica sol having an average particle size diameter within the range of 4–100 millimicrons and the amine contains a primary amino group and 2–8 carbon atoms.

3. The method of claim 2 wherein the amine is aminoethylethanolamine.

4. The method of claim 1 where the polishing agent contains a silica sol having an average particle size diameter within the range of 4–100 millimicrons and the amine contains two or more primary amino groups and 2–12 carbon atoms.

5. The method of claim 4 wherein the amine is ethylenediamine.